United States Patent [19]
Motoshima et al.

[11] Patent Number: 5,677,398
[45] Date of Patent: Oct. 14, 1997

[54] EPOXY ACRYLATE RESINS AND THEIR USES

[75] Inventors: Toshihiro Motoshima; Akio Karasawa; Keisuke Takuma; Akihiro Yamaguchi, all of Kanagawa-ken, Japan

[73] Assignee: Mitsui Toatsu Chemicals, Inc., Tokyo, Japan

[21] Appl. No.: 627,036

[22] Filed: Apr. 3, 1996

[30] Foreign Application Priority Data

Apr. 13, 1995 [JP] Japan ................. 7-087973
Jun. 1, 1995 [JP] Japan ................. 7-134893

[51] Int. Cl.$^6$ ................. C08G 59/16; C08F 283/10
[52] U.S. Cl. ................. 525/531; 525/533; 525/922; 430/280; 430/286; 522/100; 522/101
[58] Field of Search ................. 525/531, 533, 525/922; 430/280, 286; 522/100, 101

[56] References Cited

U.S. PATENT DOCUMENTS

| | | | |
|---|---|---|---|
| 3,377,406 | 4/1968 | Newey et al. | 260/837 |
| 3,980,483 | 9/1976 | Nishikubo et al. | 96/115 R |
| 4,701,566 | 10/1987 | Faler et al. | 568/719 |
| 4,701,567 | 10/1987 | Tanabe et al. | 568/719 |
| 5,009,982 | 4/1991 | Kamayachi et al. | 430/280 |
| 5,319,060 | 6/1994 | Nishikawa et al. | 525/531 |

FOREIGN PATENT DOCUMENTS

| | | |
|---|---|---|
| 44-31472 | 12/1969 | Japan. |
| 45-1465 | 1/1970 | Japan. |
| 63-150270 | 6/1988 | Japan. |
| 04-2776 | 7/1993 | Japan. |
| 60-09753 | 1/1994 | Japan. |

*Primary Examiner*—Randy Gulakowski
*Attorney, Agent, or Firm*—Burns, Doane, Swecker & Mathis

[57] ABSTRACT

Disclosed are an epoxy acrylate resin of the general formula (1)

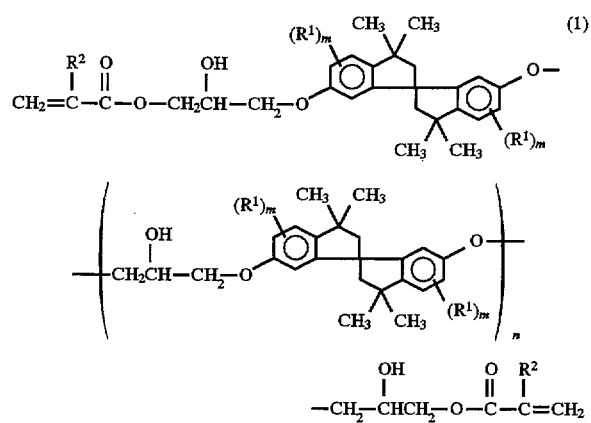

and an acid-modified epoxy acrylate resin obtained by reacting the epoxy acrylate resin with a carboxylic acid or an anhydride thereof, as well as curable resin compositions containing such a resin and the cured products thereof.

19 Claims, No Drawings

EPOXY ACRYLATE RESINS AND THEIR USES

BACKGROUND OF THE INVENTION a. Field of the Invention

This invention relates to epoxy acrylate resins, as well as curable resin compositions containing such a resin and the cured products thereof. These resins can be used as solder resist compositions, insulating paints, adhesives, printing inks, coating compositions and the like. In particular, they are useful as solder resist compositions.

b. Description of the Prior Art

Ultraviolet-curable resins are the resins most suitable to the requirements of the times such as low pollution, resource conservation, high performance and functionalization. Among them, epoxy acrylate resins are attracting attention because they have various advantages such as high chemical resistance, high heat resistance, high hardness and high adhesive power.

In the field of fabrication of printed-wiring boards, various inks such as solder resist inks and marking inks are being switched over from heat-curable resins to ultraviolet-curable resins. Among others, solder resist inks have been quickly transferred to ultraviolet-curable resins.

Screen printing is widely used to form resist patterns for printed-wiring boards. However, when this method is used, such phenomena as bleeding, blurring and sagging may occur during printing and, therefore, the resulting resist pattern may show a reduction in accuracy. Accordingly, this method fails to cope with the recent development of high density printed-wiring boards.

In order to solve these problems, dry film type photoresists and resist inks capable of being developed in a liquid state have been proposed. However, dry film type photoresists tend to produce gas bubbles during thermocompression bonding and have insufficient heat resistance and adhesion properties. When liquid resists are used, an organic solvent or a dilute aqueous alkaline solution is used as the developer. When an organic solvent is used, the resulting cured product may have insufficient solvent resistance and acid resistance, and the problem of air pollution and the like may be posed.

On the other hand, as exemplary resin compositions of the type developed with a dilute aqueous alkaline solution, phenolic novolak type epoxy acrylate resins, bisphenol A type epoxy acrylate resin, and the reaction products of these epoxy acrylate resins with a dicarboxylic acid anhydride (i.e., their acid-modified product) are well known (see, for example, Japanese Patent Laid-open No. 243869/'86 and Japanese Patent Publication No. 40329/'81). However, when these well-known epoxy acrylate resins or their acid-modified products are used, for example, as resin compositions for solder resists, the resulting cured films are insufficient in hardness, moisture resistance, heat resistance, chemical resistance, resistance to gold plating, and resistance to electrolytic corrosion. Moreover, the solubility of unexposed portions in a dilute aqueous alkaline solution (hereinafter referred to as "developability") is less than satisfactory.

SUMMARY OF THE INVENTION

It is an object of the present invention to provide resins and curable resin compositions which can solve the above-described problems, i.e., which have good developability and can yield a cured film that is excellent in hardness, moisture resistance, heat resistance, chemical resistance, resistance to gold plating, resistance to electrolytic corrosion, and the like.

As a result of intensive investigations on the above-described problems, the present inventors have now completed this invention.

That is, the present invention relates to an epoxy acrylate resin of the general formula (1)

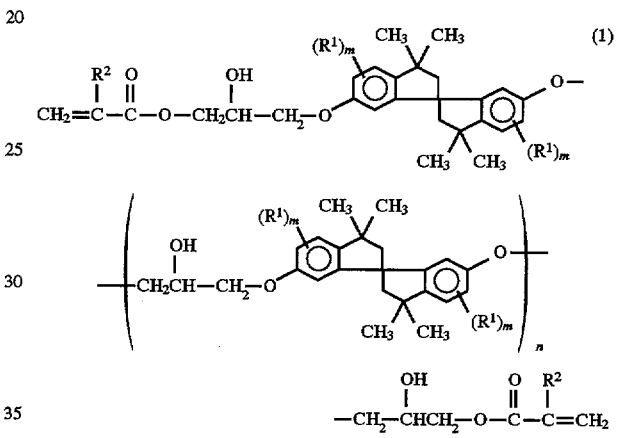

wherein each $R^1$ is independently a hydrogen atom, a straight-chain, branched or cyclic alkyl group which may have a substituent, an alkoxy group which may have a substituent, a nitro group or a halogen atom, each $R^2$ is independently a hydrogen atom or a methyl group, m is an integer of 1 to 3, and n is an integer of 0 to 10.

The present invention also relates to an epoxy acrylate resin derived from an epoxy resin of the general formula (2)

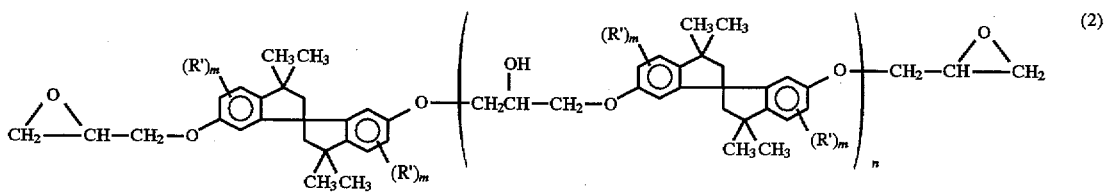

wherein each $R^1$ is independently a hydrogen atom, a straight-chain, branched or cyclic alkyl group which may have a substituent, an alkoxy group which may have a substituent, a nitro group or a halogen atom, m is an integer of 1 to 3, and n is an integer of 0 to 10, and at least one compound selected from the group consisting of acrylic acid and methacrylic acid.

The present invention also relates to an acid-modified epoxy acrylate resin obtained by reacting an epoxy acrylate resin derived from an epoxy resin of the above general formula (2) and at least one compound selected from the group consisting of acrylic acid and methacrylic acid, with a carboxylic acid or an anhydride thereof.

Moreover, the present invention relates to curable resin compositions and solder resist compositions containing an epoxy acrylate resin or acid-modified epoxy acrylate resin as described above, and further to the cured products obtained by curing these compositions.

Thus, the present invention provides epoxy acrylate resins and acid-modified epoxy acrylate resins which have good developability and can yield a cured film that is excellent in various properties (i.e., cured film hardness, moisture resistance, acid resistance, alkali resistance, solvent resistance, resistance to gold plating, and resistance to electrolytic corrosion), as well as curable resin compositions containing these resins. These curable resins are very useful as solder resist compositions.

DESCRIPTION OF THE PREFERRED EMBODIMENTS

In the compounds represented by the general formulae (1) and (2), $R^1$ is a hydrogen atom, a straight-chain, branched or cyclic alkyl group which may have a substituent, an alkoxy group which may have a substituent, a nitro group or a halogen atom. Preferably, $R^1$ is a hydrogen atom, a straight-chain, branched or cyclic alkyl group of 1 to 20 carbon atoms which may have a substituent, an alkoxy group of 1 to 20 carbon atoms which may have a substituent, a nitro group or a halogen atom.

Among others, $R^1$ is more preferably a hydrogen atom, an unsubstituted straight-chain or branched alkyl group of 1 to 10 carbon atoms, an unsubstituted straight-chain or branched alkoxy group of 1 to 10 carbon atoms, or a chlorine atom. Especially preferably, $R^1$ is a hydrogen atom, a methyl group, an ethyl group, a n-propyl group, an isopropyl group, a n-butyl group, an isobutyl group, a tert-butyl group, a methoxy group, an ethoxy group, a n-propoxy group, an isopropoxy group, a n-butoxy group, an isobutoxy group, a tert-butoxy group or a chlorine atom. Most preferably, $R^1$ is a hydrogen atom or a methyl group.

Specific examples of $R^1$ include methyl, ethyl, n-propyl, isopropyl, n-butyl, isobutyl, sec-butyl, tert-butyl, n-pentyl, n-hexyl, 2-ethylhexyl, n-octyl, n-decyl, n-dodecyl, n-tetradecyl, n-octadecyl, cyclopentyl, cyclohexyl, 4-tert-butylcyclohexyl, cycloheptyl, cyclooctyl, cyclohexylmethyl, cyclohexylethyl, tetrahydrofurfuryl, 2-methoxyethyl, 2-ethoxyethyl, 2-n-butoxyethyl, 3-methoxypropyl, 3-ethoxypropyl, 3-n-propoxypropyl, 3-n-butoxypropyl, 3-n-hexyloxypropyl, 2-methoxyethoxyethyl, 2-ethoxyethoxyethyl, 2-phenoxymethyl, 2-phenoxyethoxyethyl, chloromethyl, 2-chloroethyl, 3-chloropropyl, 2,2,2-trichloroethyl, methoxy, ethoxy, n-propoxy, isopropoxy, n-butoxy, isobutoxy, sec-butoxy, n-pentyloxy, n-hexyloxy, 2-ethylhexyloxy, n-octyloxy, n-decyloxy, n-dodecyloxy, n-tetradecyloxy, n-octadecyloxy, cyclopentyloxy, cyclohexyloxy, 4-tert-butylcyclohexyloxy, cycloheptyloxy, cyclooctyloxy, cyclohexylmethyloxy, cyclohexylethyloxy, 2-methoxyethyloxy, 2-ethoxyethyloxy, 2-n-butoxyethyloxy, 3-methoxypropyloxy, 3-ethoxypropyloxy, 3-n-propoxypropyloxy, 3-n-butoxypropyloxy, 3-n-hexyloxypropyloxy, 2-methoxyethoxyethyloxy, 2-phenoxymethyloxy, 2-phenoxyethoxyethyloxy, chloromethyloxy, 2-chloroethyloxy, 3-chloropropyloxy, 2,2,2-trichloroethyloxy and nitro groups, and fluorine, chlorine, bromine and iodine atoms.

In the general formula (1), $R^2$ is a hydrogen atom or a methyl group. Moreover, in the general formulae (1) and (2), m is an integer of 1 to 3 and n is an integer of 0 to 10.

The epoxy acrylate resins represented by the general formula (1) can preferably be prepared according to methods which are well known per se, such as those described in Japanese Patent Publication Nos. 31472/'69 and 1465/'70. Typically, they may be prepared, for example, by reacting an epoxy resin of the general formula (2) with acrylic acid, methacrylic acid or a mixture thereof.

The epoxy resins represented by the general formula (2) can be prepared, for example, according to the method described in Japanese Patent Laid-open No. 150270/'88. More specifically, they may be prepared, for example, by reacting 6,6'-dihydroxy-3,3,3',3'-tetramethyl-1,1'-spirobiindane with an epihalohydrin in the presence of a dehydrogen-halide agent.

In the preparation of the epoxy acrylate resins represented by the general formula (1), no particular limitation is placed on the amount in which acrylic acid, methacrylic acid or a mixture thereof is used relative to an epoxy resin of the general formula (2). However, acrylic acid, methacrylic acid or a mixture thereof is preferably used in an amount of 0.1 to 5 chemical equivalents, more preferably 0.3 to 3 chemical equivalents, for each chemical equivalent of the epoxy group present in the epoxy resin.

During this reaction, a diluent is preferably added to the reaction system. Suitable diluents include, for example, organic solvents such as butyl cellosolve acetate, ethyl cellosolve acetate, methyl ethyl ketone, carbitol acetate, isopropyl cellosolve acetate, diethylene glycol dimethyl ether and solvent naphtha; and monomers such as styrene, vinyl acetate, N-vinylpyrrolidone, butyl acrylate, carbitol (meth)acrylate, phenoxyethyl (meth)acrylate, tripropylene glycol di(meth)acrylate, 1,6-hexanediol di(meth)acrylate, tetraethylene glycol di(meth)acrylate, pentaerythritol tetra (meth)acrylate, trimethylolpropane tri(meth)acrylate, tris (hydroxyethyl)isocyanurate tri(meth)acrylate and dipentaerythritol hexa(meth)acrylate.

Moreover, a catalyst may preferably be used in order to accelerate the reaction. Preferred examples of the catalyst include triethylamine, benzyldimethylamine, N,N-dimethylbenzylamine, dimethylaniline, methyltriethylammonium chloride, triethylbenzylammonium chloride, benzyltrimethylammonium hydroxide, triphenylstibine, triphenylphosphine and potassium hydroxide. The catalyst is preferably used in an amount of 0.1 to 10% by weight, more preferably 0.3 to 5% by weight, based on the mixture of the starting materials.

Furthermore, a polymerization inhibitor may preferably be used in order to prevent polymerization during the reaction. Preferred examples of the polymerization inhibitor include metoquinone, hydroquinone and phenothiazine. The polymerization inhibitor is preferably used in an amount of 0.01 to 3% by weight, more preferably 0.05 to 1% by weight, based on the mixture of the starting materials.

Although the reaction temperature may vary according to the type of the catalyst used, it is preferable to use a temperature at which the reaction of the epoxy resin of the general formula (2) with acrylic acid or methacrylic acid proceeds and the thermal polymerization of the starting materials, the intermediates or the reaction product does not occur. Specifically, the reaction temperature is more preferably in the range of 60° to 150° C. and most preferably in the range of 80° to 130° C. Although the reaction time depends on the reaction temperature, it preferably ranges from 2 to 80 hours and more preferably from 3 to 50 hours.

After completion of the reaction, the excess of (meth) acrylic acid, the diluent and the like may be removed by any suitable technique such as distillation. Alternatively, the reaction product may be used without removing them.

Next, the acid-modified epoxy acrylate resins of the present invention are described below.

The acid-modified epoxy acrylate resins of the present invention are prepared by reacting an epoxy acrylate resin derived from an epoxy resin of the general formula (2) and at least one compound selected from the group consisting of acrylic acid and methacrylic acid, with a carboxylic acid or an anhydride thereof.

The carboxylic acid is a mono- or polycarboxylic acid, preferably an aliphatic mono- or polycarboxylic acid or an aromatic mono- or polycarboxylic acid, and more preferably an aliphatic mono- or dicarboxylic acid or an aromatic mono- or dicarboxylic acid.

Suitable carboxylic acids and anhydrides thereof include, for example, acetic acid, propionic acid, butyric acid, valeric acid, trimethylacetic acid, hexanoic acid, heptanoic acid, octanoic acid, 2-ethylhexanoic acid, myristic acid, cyclohexanecarboxylic acid, 4-methylcyclohexanecarboxylic acid, methoxyacetic acid, phenoxyacetic acid, phenylacetic acid, acrylic acid, methacrylic acid, benzoic acid, 4-methylbenzoic acid, 4-tert-butylbenzoic acid, 3-methoxybenzoic acid, 2,4-dimethylbenzoic acid, 4-biphenylcarboxylic acid, 1-naphthoic acid, 2-naphthoic acid, maleic acid, succinic acid, itaconic acid, phthalic acid, tetrahydrophthalic acid, hexahydrophthalic acid, methylhexahydrophthalic acid, endomethylenetetrahydrophthalic acid, chlorendic acid, methyltetrahydrophthalic acid, trimellitic acid, pyromellitic acid and benzophenonetetracarboxylic acid, as well as anhydrides of the foregoing carboxylic acids.

The above-defined carboxylic acid or anhydride thereof is preferably used in an amount of 0.01 to 1.2 chemical equivalents, more preferably 0.05 to 1.0 chemical equivalent, for each chemical equivalent of the hydroxyl group in the aforesaid epoxy acrylate resin.

If desired, any of various well-known esterification catalysts, the above-described diluents and the like may be added to the reaction system. Although no particular limitation is placed on the reaction temperature, it is preferable to use a temperature at which thermal polymerization of the starting epoxy acrylate resin and the like does not occur. Specifically, the reaction temperature is preferably in the range of 50° to 180° C. and more preferably in the range of 80° to 150° C.

Although the reaction time depends on the reaction temperature, it preferably ranges from 30 minutes to 80 hours and more preferably from 1 to 50 hours.

After completion of the reaction, the acid-modified epoxy acrylate resin of the present invention may be separated by any well-known technique such as distillation. The acid-modified epoxy acrylate resin of the present invention may contain epoxy groups in the molecule. The acid-modified epoxy acrylate resin containing epoxy groups can be obtained by controlling the amount of acrylic acid, methacrylic acid or a mixture thereof used for the reaction with the epoxy resin within the above-described range to keep some unreacted epoxy groups in the epoxy acrylate resin obtained by the reaction and subjecting the unreacted epoxy groups in the epoxy acrylate resin to acid-modification. The heat-curability of the resin tends to increase and the heat-cured products have excellent coating properties, although the sensitivity to ultraviolet rays (photo-curability) tends to decrease, when the acid-modified epoxy acrylate resin contains the epoxy groups in a large amount, that is, it contains (meth)acryloyl groups in a small amount. Therefore, the resin can contain the epoxy groups as long as it does not spoil the effects of the present invention.

The acid value (mg KOH/g) of the acid-modified epoxy acrylate resin may be suitably adjusted according to the intended use thereof. However, its acid value (mg KOH/g) is preferably in the range of 20 to 300, more preferably 30 to 250, and most preferably 50 to 150.

Next, the curable resin compositions of the present invention are more specifically described below.

These curable resin compositions are characterized by containing one of the above-described epoxy acrylate resins and acid-modified epoxy acrylate resins of the present invention, and may also contain various well-known resins, photopolymerization initiators and/or thermal polymerization initiators. If desired, these curable resin compositions may additionally contain inorganic fillers, coloring pigments and the like. As the epoxy acrylate resin or acid-modified epoxy acrylate resin of the present invention, the above-described reaction product may be used directly. In the curable resin compositions of the present invention, the epoxy acrylate resin or acid-modified epoxy acrylate resin of the present invention is preferably contained in an amount of 10 to 90% by weight and more preferably 20 to 80% by weight.

In addition to the above-described epoxy acrylate resin of the present invention, the curable resin compositions of the present invention may contain epoxy compounds such as phenolic novolak type epoxy resins, cresol novolak type epoxy resins, bisphenol type epoxy resins, and tris(2,3-epoxypropyl) isocyanurate; epoxy (meth)acrylates formed by the reaction of these epoxy compounds with (meth)acrylic acid; polyester acrylates; prepolymers or polymerizable monomers derived from the above-described reactive monomers; and the like. These additional components are preferably used in an amount of not greater than 200 parts by weight, more preferably not greater than 100 parts by weight, per 100 parts by weight of the epoxy acrylate resin of the present invention. When an epoxy compound is used, an epoxy resin curing agent may be used. Suitable epoxy resin curing agents include, for example, dicyandiamide and derivatives thereof, imidazole compounds, triazine compounds, urea compounds, aromatic amines, polyphenol compounds and cationic photopolymerization catalysts. The epoxy resin curing agent is preferably used in an amount of 0.1 to 50 parts by weight, more preferably 0.5 to 30 parts by weight, per 100 parts by weight of the aforesaid epoxy compound.

Of course, two or more of the epoxy acrylate resins of the present invention may be used in combination.

As the photopolymerization initiator, there may be used any of various well-known photopolymerization initiators. Preferred photopolymerization initiators include, for example, benzoin, benzil, benzoin methyl ether, benzoin isopropyl ether, acetophenone, 2,2-dimethoxy-2-phenylacetophenone, 1,1-dichloroacetophenone, 1-hydroxycyclohexyl phenyl ketone, 2-methyl-1-(4-methylthiophenyl)-2-morpholinolpropan-1-one, N,N-dimethylaminoacetophenone, 2-methylanthraquinone, 2-ethylanthraquinone, 2-tert-butylanthraquinone, 1-chloroanthraquinone, 2-amylanthraquinone, 2-isopropyl thioxanthone, 2,4-dimethylthioxanthone, 2,4-diethylthioxanthone, 2,4-diisopropylthioxanthone, acetophenone dimethyl ketal, benzophenone, 4-methylbenzophenone, 4,4'-dichlorobenzophenone, 4,4'-bis(diethylamino)benzophenone and Michler's ketone.

These photopolymerization initiators may be used alone or in admixture of two or more.

The photopolymerization initiator is preferably used in an amount of 0 to 50 parts by weight, more preferably 4 to 35 parts by weight, per 100 parts by weight of the epoxy acrylate resin or acid-modified epoxy acrylate resin of the present invention.

Moreover, it is preferable to use such a photopolymerization initiator in combination with one or more well-known photosensitizers. Suitable photosensitizers include, for example, N,N-dimethylaminobenzoic acid ethyl ester, N,N-dimethylaminobenzoic acid isoamyl ester, triethanolamine and triethylamine.

Preferred combinations of a photopolymerization initiator and a photosensitizer include a combination of 2,4-diethylthioxanthone or 2-isopropylthioxanthone and N,N-dimethylaminobenzoic acid ethyl ester; and the like. Preferred combinations of photopolymerization initiators include a combination of 2-methyl-1-(4-methylthiophenyl)-2-morpholinopropan-1-one and 2,4-diethylthioxanthone or 2-isopropylthioxanthone; and the like.

No particular limitation is placed on the type of the radical polymerization initiator used for thermal polymerization. Preferred radical polymerization initiators include, for example, well-known peroxides such as benzoyl peroxide, p-chlorobenzoyl peroxide, diisopropyl peroxycarbonate, di-2-ethylhexyl peroxycarbonate and tert-butyl peroxypivalate; and azo compounds such as azobisisobutyronitrile. The thermal polymerization initiator is preferably used in an amount of 0 to 50 parts by weight, more preferably 0.01 to 35 parts by weight, per 100 parts by weight of the epoxy acrylate resin or acid-modified epoxy acrylate resin of the present invention.

Furthermore, in preparing the curable resin compositions of the present invention, inorganic fillers (e.g., talc, silica, alumina, barium sulfate and magnesium oxide), thixotropic agents (e.g., aerogel), melamine resins (e.g., hexamethoxymelamine and hexabutoxymelamine), leveling agents (e.g., silicone, fluoropolymers and acrylic copolymers), coloring pigments (e.g., Cyanine Green and Cyanine Blue), antifoaming agents, ultraviolet absorbers, antioxidants, polymerization inhibitors, flow control agents and the like may be added thereto as required.

The curable resin compositions prepared in the above-described manner are useful in various applications such as solder resist compositions, insulating paints, adhesives, printing inks and coating compositions. In particular, they have good performance as solder resist compositions. When the curable resin compositions of the present invention are used as solder resist compositions, various compounds which can be used in the above-described curable resin compositions may be added thereto.

The cured products of the present invention are obtained by curing the curable resin compositions of the present invention which have been prepared in the above-described manner, according to any well-known technique such as exposure to electron rays, ultraviolet light or heat. Preferably, the cured products are obtained by subjecting the curable resin compositions to an ultraviolet cure and then to a thermal cure as required.

When a thermal cure is carried out, the heating temperature preferably ranges from 80° to 180° C. and more preferably from 120° to 170° C. Although the heating time is affected by the heating temperature, it usually ranges from 5 minutes to 20 hours, preferably from 10 minutes to 10 hours, and more preferably from 30 minutes to 2 hours.

When an epoxy acrylate resin in accordance with the present invention is used as a solder resist composition, the cured product thereof can be obtained, for example, according to the following procedure: Using a technique such as screen printing, spraying, roll coating, electrostatic coating or curtain flow coating, the epoxy acrylate resin of the present invention is applied to a printed-wiring board to a thickness of 10 to 100 μm. The coating film is preferably dried at a temperature ranging from room temperature to 100° C. and more preferably from 60° to 80° C. A solder mask pattern film is brought into direct contact with the coating film and then exposed to ultraviolet light. Subsequently, the unexposed portions of the coating film are removed by dissolving them in an aqueous alkaline solution such as a 0.5–2% aqueous solution of sodium carbonate, a 0.5–1% aqueous solution of sodium hydroxide or a 0.5–1% aqueous solution of potassium hydroxide. Thereafter, using a heating temperature preferably ranging from 80° to 180° C. and more preferably from 120° to 170° C. and a heating time preferably ranging from 10 minutes to 10 hours and more preferably from 30 minutes to 2 hours, the coating film is thermally cured to form a cured film.

The present invention is further illustrated by the following preparation examples and examples. However, these preparation examples and examples are not to be construed to limit the scope of the present invention.

REFERENCE PREPARATION EXAMPLE

[Preparation of an Epoxy Resin of Formula (3)]

A reaction vessel was charged with 154 g of 6,6'-dihydroxy-3,3,3',3'-tetramethyl-1,1'-spirobiindane and 463 g of epichlorohydrin, and heated to 95° C. until a solution was formed. Then, 110 g of a 40% aqueous solution of sodium hydroxide was added dropwise thereto over a period of 3 hours and the resulting mixture was stirred at 90°–100° C. for 2 hours. After being cooled, this mixture was mixed with 200 ml of methyl ethyl ketone and washed repeatedly with water until the chloride and the small excess of sodium hydroxide were removed. The organic layer was freed of solvent and epichlorohydrin by vacuum distillation to obtain 211 g of an epoxy resin of formula (3). Its yield was 89%. Analysis by liquid chromatography revealed that the epoxy resin was composed of 86% of a fraction with n=0, 8% of a fraction with n=1, and 6% of a fraction with n≧2 (the percentages given in this example and hereinafter are area percentages unless otherwise stated). It had an epoxy equivalent of 238 g/eq. and a softening point of 50° C.

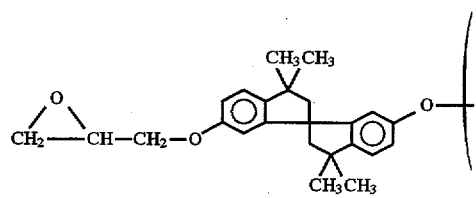 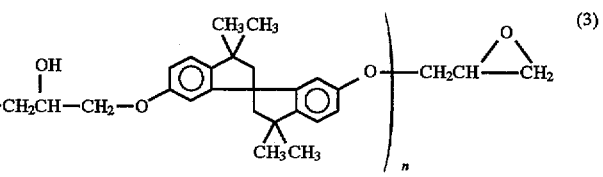

PREPARATION EXAMPLE 1

A reaction vessel was charged with 238 g of an epoxy resin of the above formula (3) which had been prepared in the manner described in the foregoing Reference Preparation Example [n=0, 86%; n=1, 8%; n≧2, 6%; epoxy equivalent 238 g/eq.], 72 g of acrylic acid, 0.9 g of triethylamine, 0.1 g of hydroquinone and 31 g of styrene as a diluent. This mixture was stirred at 80° C. for an hour and then at 130° C. for 3 hours with air blown thereinto. Thus, there was obtained 327 g of an epoxy acrylate resin in the form of wax. This compound had an acid value (mg KOH/g) of 3.0 and an ICI viscosity of 1.8 poises (at 100° C.). Analysis by liquid chromatography revealed that the epoxy acrylate resin of the following formula (1-i) was composed of 86% of a fraction with n=0, 8% of a fraction with n=1, and 6% of a fraction with n≧2, the composition was same as that of the raw material (epoxy resin).

Preparation Example [n=0, 81%; n=1, 14%; n≧2, 5%; epoxy equivalent 285 g/eq.], 72 g of acrylic acid, 0.9 g of triethylamine, 0.1 g of hydroquinone and 31 g of 1,6-hexanediol diacrylate as a diluent. This mixture was stirred at 80° C. for an hour and then at 130° C. for 3 hours with air blown thereinto. Thus, there was obtained 327 g of an epoxy acrylate resin in the form of wax. This resin had an acid value (mg KOH/g) of 6.7 and an ICI viscosity of 19.6 poises (at 100° C.).

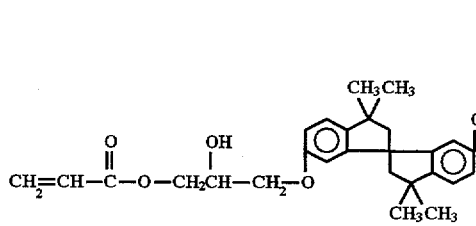 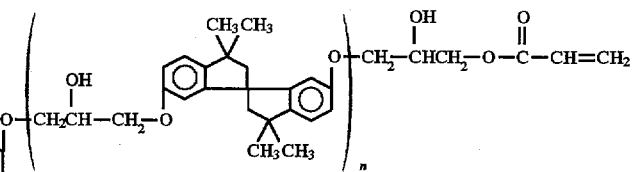

PREPARATION EXAMPLE 2

A reaction vessel was charged with 245 g of an epoxy resin of the above formula (3) which had been prepared in

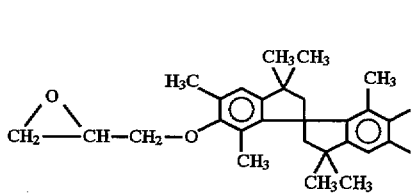 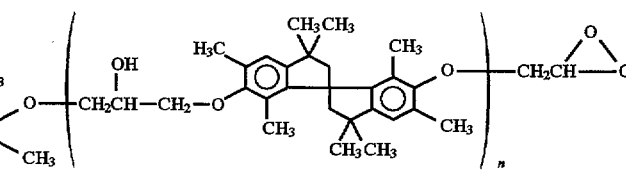

substantially the same manner as described in Reference Preparation Example [n=0, 84%; n=1, 7%; n≧2, 9%; epoxy equivalent 245 g/eq.], 144 g of acrylic acid, 1.2 g of triethylamine, 0.2 g of hydroquinone and 39 g of styrene as a diluent. This mixture was stirred at 80° C. for an hour and then at 130° C. for 3 hours with air blown thereinto. Thereafter, the excess of acrylic acid was distilled off to obtain 344 g of an epoxy acrylate resin in the form of wax. This resin had an acid value (mg KOH/g) of 24.4 and an ICI viscosity of 21.0 poises (at 100° C.).

PREPARATION EXAMPLE 3

A reaction vessel was charged with 285 g of an epoxy resin of the following formula (4) which had been prepared in substantially the same manner as described in Reference

PREPARATION EXAMPLE 4

A reaction vessel was charged with 238 g of an epoxy resin of the above formula (3) which had been prepared in the manner described in the foregoing Reference Preparation Example [n=0, 86%; n=1, 8%; n≧2, 6%; epoxy equivalent 238 g/eq.], 72 g of acrylic acid, 0.9 g of triethylamine, 0.1 g of hydroquinone and 31 g of styrene as a diluent. This mixture was stirred at 80° C. for an hour and then at 130° C. for 3 hours with air blown thereinto. Thus, there was obtained 327 g of a reaction product in the form of wax. Then, 130 g of maleic anhydride was added to 327 g of this reaction product, and the resulting mixture was reacted at 100° C. for 10 hours to obtain 412 g of an acid-modified epoxy ester resin. This resin had an acid value (mg KOH/g) of 104.3 and an ICI viscosity of 8 poises (at 100° C.).

PREPARATION EXAMPLE 5

A reaction vessel was charged with 245 g of an epoxy resin of the above formula (3) which had been prepared in substantially the same manner as described in Reference Preparation Example [n=0, 84%; n=1, 7%; n≧2, 9%; epoxy equivalent 245 g/eq.], 144 g of acrylic acid, 1.2 g of triethylamine, 0.2 g of metoquinone and 50 g of styrene as a diluent. This mixture was stirred at 80° C. for an hour and then at 130° C. for 3 hours with air blown thereinto. Thereafter, the excesses of acrylic acid and styrene were distilled off to obtain 344 g of a reaction product in the form of wax. Then, 120 g of tetrahydromaleic anhydride and 80 g of carbitol acetate were added to this reaction product, and the resulting mixture was reacted at 90° C. for 20 hours to obtain 498 g of an acid-modified epoxy acrylate resin. This resin had an acid value (mg KOH/g) of 98.4 and an ICI viscosity of 17 poises (at 100° C.).

PREPARATION EXAMPLE 6

A reaction vessel was charged with 285 g of an epoxy resin of the above formula (4) which had been prepared in substantially the same manner as described in Reference Preparation Example [n=0, 81%; n=1, 14%; n≧2, 5%; epoxy equivalent 285 g/eq.], 72 g of acrylic acid, 0.9 g of triethylamine, 0.1 g of hydroquinone and 31 g of 1,6-hexanediol diacrylate as a diluent. This mixture was stirred at 80° C. for an hour and then at 130° C. for 3 hours with air blown thereinto. Thus, there was obtained 327 g of a reaction product. Then, 190 g of trimellitic anhydride was added to this reaction product, and the resulting mixture was reacted at 90° C. for 20 hours to obtain 511 g of an acid-modified epoxy acrylate resin. This resin had an acid value (mg KOH/g) of 112.1 and an ICI viscosity of 24 poises (at 100° C.).

PREPARATION EXAMPLE 7

The procedure of Preparation Example 4 was repeated, except that 36 g of acrylic acid was used in place of 72 g of acrylic acid. Thus, there was obtained 365 g of an acid-modified epoxy acrylate resin. This resin had an acid value (mg KOH/g) of 51.5 and an ICI viscosity of 79 poises (at 100° C.).

PREPARATION EXAMPLE 8

The procedure of Preparation Example 4 was repeated, except that 54 g of acrylic acid and 150 g of maleic anhydride were used in place of 72 g of acrylic acid and 130 g of maleic anhydride, respectively. Thus, there was obtained 391 g of an acid-modified epoxy acrylate resin. This resin had an acid value (mg KOH/g) of 74.3 and an ICI viscosity of 55 poises (at 100° C.).

PREPARATION EXAMPLE 9

The procedure of Preparation Example 4 was repeated, except that 54 g of acrylic acid and 110 g of acetic anhydride were used in place of 72 g of acrylic acid and 130 g of maleic anhydride, respectively. Thus, there was obtained 350 g of an acid-modified epoxy acrylate resin. This resin had an ICI viscosity of 52 poises (at 100° C.).

EXAMPLE 1-9

Using the epoxy acrylate resins obtained in Preparation Examples 1-9 and various materials shown in Table 1, solder resist compositions (or inks) were prepared by mixing the ingredients according to each of the formulations (in which the values are in parts by weight) and kneading the resulting mixture on a roll mill. Using these solder resist compositions (or inks), resist-coated boards were made according to the procedure for the fabrication of resist-coated boards which is described below. The resist-coated boards so made were evaluated according to the evaluation procedures described below, and the results thus obtained are shown in Table 2.

COMPARATIVE EXAMPLES 1-3

Using conventionally used resin compositions given below and various materials shown in Table 1, solder resist compositions (or inks) were prepared in the same manner as in the foregoing Examples. These solder resist compositions (or inks) were evaluated in the same manner as in the foregoing Examples, and the results thus obtained are shown in Table 2.

[Procedure for the Fabrication of Resist-Coated Boards]

Using the screen printing technique, a solder resist composition (or ink) was applied to the entire front surface of a copper-plate through-hole printed-wiring board so as to give a dried film thickness of 15 to 25 μm, and predried at 70° C. for 15 minutes. Then, the solder resist composition was applied to the back surface thereof in the same manner as described above, and predried at 70° C. for 25 minutes.

Next, solder mask pattern films were brought into contact with the coated surfaces and exposed to light at a luminous power of 500 nJ/cm$^2$ by means of a metal halide lamp double-side exposure apparatus (HMW680; made by Orc Manufacturing Co., Ltd.). Then, the coating film was treated with a 1.0 wt. % aqueous solution of sodium carbonate at a spray pressure of 2.5 kg/cm$^2$ and a solution temperature of 25° C. for 60 seconds to dissolve and remove the unexposed portions thereof.

The developability of the uncured resist-coated board thus obtained was evaluated according to the procedure described below. Thereafter, the resist-coated board was cured by heating it in a hot-air oven at 150° C. for 60 minutes. The resulting resist-coated board having a cured film was tested for cured film hardness (pencil hardness), moisture resistance, resistance to soldering heat, acid resistance, alkali resistance, solvent resistance, resistance to gold plating, and resistance to electrolytic corrosion according to the procedures described below.

[Procedures for the Evaluation of Resist-Coated Boards]

(1) Developing Properties

Using a magnifying glass, the developability of an uncured resist-coated board was evaluated by visual inspection.

○: The pattern was completely developed.

Δ: A part of the pattern was not completely developed.

X: A substantial part of the pattern was not developed.

(2) Cured Film Hardness

Using a resist-coated board having a cured film, the pencil hardness of the cured film was measured according to JIS K-5400.

(3) Moisture Resistance

After a resist-coated board having a cured film was cooked in boiling water at 100° C. for 2 hours, the cured film was visually examined for change in appearance.

○: No change in appearance was observed.

Δ: Swelling was observed in a part of the cured film.

X: Swelling or deformation was observed in a substantial part of the cured film.

(4) Resistance to Soldering Heat

A resist-coated board having a cured film was tested according to JIS C6481. That is, a specimen was dipped in a solder bath (JS-64P; manufactured by San-ei Chemical Co., Ltd.) at 260° C. for 10 seconds, and this dip was repeated ten times. Thereafter, the cured film was visually examined for change in appearance.

◯: No change in appearance was observed.

Δ: A color change was observed in a part of the cured film.

X: Lifting or peeling, along with an invasion of solder, was observed in a substantial part of the cured film.

(5) Acid Resistance

A specimen was immersed in a 10 vol. % aqueous solution of sulfuric acid at 25° C. for 15 minutes. Thereafter, the cured film was visually examined for change in appearance.

◯: No change in appearance was observed.

Δ: A part of the cured film was peeled off.

X: Lifting was observed in a substantial part of the cured film, and the cured film was easily peeled off.

(6) Alkali Resistance

A specimen was immersed in a 10 wt. % aqueous solution of sodium hydroxide at 25° C. for 15 minutes. Thereafter, the cured film was visually examined for change in appearance.

◯: No change in appearance was observed.

Δ: A part of the cured film was peeled off.

X: Lifting was observed in a substantial part of the cured film, and the cured film was easily peeled off.

(7) Solvent Resistance

A specimen was immersed in dichloromethane at 25° C. for 30 minutes. Thereafter, the cured film was visually examined for change in appearance.

◯: No change in appearance was observed.

Δ: Swelling was observed in a part of the cured film.

X: Swelling and solvent infiltration were observed in a substantial part of the cured film.

(8) Resistance to Gold Plating

Using Autorenex CI (gold plating liquid made by Sel-Rex Corp.), a specimen was plated with gold at a current density of 1.0 A/dm$^2$ for 30 minutes. Thereafter, the plated specimen was subjected to a peeling test using an adhesive tape (cellophane tape; manufactured by Sekisui Chemical Co., Ltd.) and examined visually.

◯: The cured film was not peeled off at all.

Δ: A part of the cured film was peeled off.

X: Most of the cured film was peeled off.

(9) Resistance to Electrolytic Corrosion

Under conditions including a temperature of 120° C., a relative humidity of 100%, a pressure of 2 atmospheres and an applied voltage of 100 V, a specimen was allowed to stand for 30 hours. Thereafter, the specimen was visually examined for color and surface changes.

◯: Neither color change nor surface change was observed on both the positive and the negative side.

Δ: A slight color change was observed on either the positive or the negative side.

X: A color change and surface abnormalities were observed on both the positive and the negative side.

TABLE 1

| | Example | | | | | |
|---|---|---|---|---|---|---|
| | 1 | 2 | 3 | 4 | 5 | 6 |
| Preparation Example 1 | 110 | — | 55 | — | — | — |
| Preparation Example 2 | — | 110 | — | — | — | — |
| Preparation Example 3 | — | — | 55 | — | — | — |
| Preparation Example 4 | — | — | — | 110 | — | — |
| Preparation Example 5 | — | — | — | — | 110 | — |
| Preparation Example 6 | — | — | — | — | — | 110 |
| KAYARAD R-2058 | 20 | 20 | 20 | 20 | 20 | 20 |
| TEPIC-S | — | 30 | — | — | 30 | — |
| EPPN-201 | — | — | — | — | — | 30 |
| KAYARAD DPHA | 5 | 15 | 5 | 5 | 15 | 10 |
| CAR-Ac | 10 | 10 | 10 | 10 | 10 | 10 |
| Irgacure-907 | 10 | 10 | 10 | 10 | 10 | 5 |
| DIAMID (curing agent) | — | — | — | — | — | 5 |
| Pc-green (pigment) | 2 | 2 | 2 | 2 | 2 | 2 |
| KS-603 (anti-foaming agent) | 2 | 2 | 2 | 2 | 2 | 2 |
| Talc | 40 | 60 | 40 | 40 | 40 | 40 |

| | Example | | | Comparative Example | | |
|---|---|---|---|---|---|---|
| | 7 | 8 | 9 | 1 | 2 | 3 |
| Preparation Example 7 | 110 | — | — | — | — | — |
| Preparation Example 8 | — | 110 | — | — | — | — |
| Preparation Example 9 | — | — | 110 | — | — | — |
| KAYARAD R-5027 | — | — | — | 110 | — | — |
| KAYARAD R-5089 | — | — | — | — | 110 | — |
| KAYARAD R-114 | — | — | — | — | — | 110 |
| KAYARAD R-2058 | 20 | 20 | 20 | 20 | 20 | 20 |
| TEPIC-S | — | — | — | — | — | — |
| EPPN-201 | — | 30 | 30 | — | — | — |
| KAYARAD DPHA | 5 | 10 | 10 | 5 | 5 | 5 |
| CAR-Ac | 10 | 10 | 10 | 10 | 10 | 10 |
| Irgacure-907 | 10 | 5 | 5 | 10 | 10 | 10 |
| DIAMID (curing agent) | — | — | — | — | — | — |
| Pc-green (pigment) | 2 | 2 | 2 | 2 | 2 | 2 |
| KS-603 (anti-foaming agent) | 2 | 2 | 2 | 2 | 2 | 2 |
| Talc | 40 | 40 | 40 | 40 | 40 | 40 |

KAYARAD R-5027: The reaction product of a phenolic novolak type epoxy acrylate with a dibasic acid anhydride (manufactured by Nippon Kayaku Co., Ltd.) containing 40% by weight of butyl cellosolve acetate and having an acid value (mg KOH/g) of 68.5.

KAYARAD R-5089: The reaction product of a bisphenol A type epoxy acrylate with a dibasic acid anhydride (manufactured by Nippon Kayaku Co., Ltd.) containing 40% by weight of carbitol acetate and having an acid value (mg KOH/g) of 63.

KAYARAD R-114: A bisphenol A type epoxy acrylate (manufactured by Nippon Kayaku Co., Ltd.).

KAYARAD R-2058: A phenolic novolak type epoxy acrylate (manufactured by Nippon Kayaku Co., Ltd.) containing 30% by weight of butyl cellosolve acetate.

TEPIC-S: Tris(2,3-epoxypropyl) isocyanurate (manufactured by Nissan Chemical Industries Ltd.) having a melting point of 95°–125° C.

EPPN-201: A phenolic novolak type epoxy resin acrylate (manufactured by Nippon Kayaku Co., Ltd.) having a softening point of 65° C.

KAYARAD DPHA: Dipentaerythritol hexaacrylate (manufactured by Nippon Kayaku Co., Ltd.).

CAR-Ac: Carbitol acetate.

Irgacure-907: A photopolymerization initiator (manufactured by Ciba-Geigy Ltd.).

DIAMID (curing agent): Dicyandiamide that is an epoxy resin curing agent.

Pc-green (pigment): Phthalocyanine Green.

KS-603: An antifoaming agent (manufactured by Shin-Etsu Chemical Co., Ltd.)

TABLE 2

| | Example | | | | | |
|---|---|---|---|---|---|---|
| | 1 | 2 | 3 | 4 | 5 | 6 |
| Developability | ○ | ○ | ○ | ○ | ○ | ○ |
| Cured film hardness | 9H | 9H | 9H | 9H | 9H | 9H |
| Moisture resistance | ○ | ○ | ○ | ○ | ○ | ○ |
| Resistance to soldering heat | ○ | ○ | ○ | ○ | ○ | ○ |
| Acid resistance | ○ | ○ | ○ | ○ | ○ | ○ |
| Alkali resistance | ○ | ○ | ○ | ○ | ○ | ○ |
| Solvent resistance | ○ | ○ | ○ | ○ | ○ | ○ |
| Resistance to gold plating | ○ | ○ | ○ | ○ | ○ | ○ |
| Resistance to electrolytic corrosion | ○ | ○ | ○ | ○ | ○ | ○ |

| | Example | | | Comparative Example | | |
|---|---|---|---|---|---|---|
| | 7 | 8 | 9 | 1 | 2 | 3 |
| Developability | ○ | ○ | ○ | X | ○ | ○ |
| Cured film hardness | 9H | 9H | 9H | 8H | 7H | 6H |
| Moisture resistance | ○ | ○ | ○ | X | Δ | Δ |
| Resistance to soldering heat | ○ | ○ | ○ | ○ | Δ | Δ |
| Acid resistance | ○ | ○ | ○ | X | Δ | Δ |

TABLE 2-continued

| Alkali resistance | ○ | ○ | ○ | Δ | ○ | ○ |
|---|---|---|---|---|---|---|
| Solvent resistance | ○ | ○ | ○ | Δ | Δ | Δ |
| Resistance to gold plating | ○ | ○ | ○ | X | Δ | Δ |

TABLE 2-continued

| Resistance to electrolytic corrosion | ○ | ○ | ○ | X | Δ | Δ |
|---|---|---|---|---|---|---|

As is evident from Table 2, solder resist compositions comprising an epoxy acrylate resin or acid-modified epoxy acrylate resin in accordance with the present invention are more excellent in cured film hardness (pencil hardness), moisture resistance, acid resistance, alkali resistance, solvent resistance, resistance to gold plating, and resistance to electrolytic corrosion, as compared with solder resist compositions comprising conventionally known epoxy acrylate resins. With respect to developability, the former bears comparison with the latter.

What is claimed is:

1. An epoxy acrylate resin of the general formula (1):

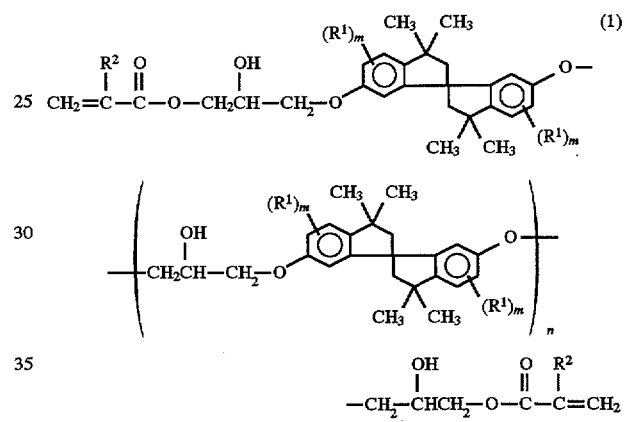

wherein each $R^1$ is independently a hydrogen atom, a straight-chain, branched or cyclic alkyl group, an alkoxy group, a nitro group or a halogen atom, each $R^2$ is independently a hydrogen atom or a methyl group, m is an integer of 1 to 3, and n is an integer of 0 to 10.

2. An epoxy acrylate resin derived from an epoxy resin of the general formula (2)

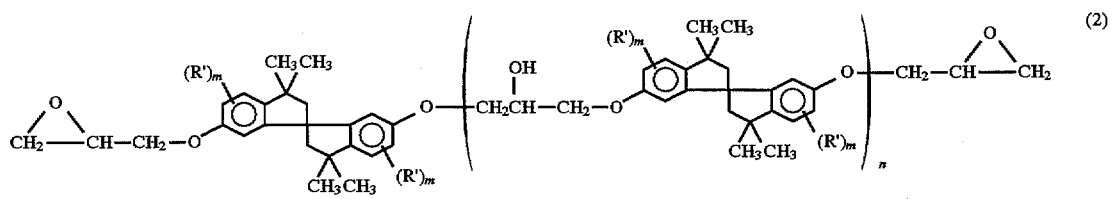

wherein each $R^1$ is independently a hydrogen atom, a straight-chain, branched or cyclic alkyl group, an alkoxy group, a nitro group or a halogen atom, m is an integer of 1 to 3, and n is an integer of 0 to 10, and at least one compound selected from the group consisting of acrylic acid.

3. An acid-modified epoxy acrylate resin obtained by reacting an epoxy acrylate resin as claimed in claim 2 with a carboxylic acid or an anhydride thereof.

4. A curable resin composition containing an epoxy acrylate resin as claimed in claim 1.

5. A curable resin composition containing an epoxy acrylate resin as claimed in claim 2.

6. A curable resin composition containing an epoxy acrylate resin as claimed in claim 3.

7. A solder resist composition containing an epoxy acrylate resin as claimed in claim 1.

8. A solder resist composition containing an epoxy acrylate resin as claimed in claim 2.

9. A solder resist composition containing an epoxy acrylate resin as claimed in claim 3.

10. The cured product obtained by curing a composition as claimed in claim 4.

11. The cured product obtained by curing a composition as claimed in claim 5.

12. The cured product obtained by curing a composition as claimed in claim 6.

13. The cured product obtained by curing a composition as claimed in claim 7.

14. The cured product obtained by curing a composition as claimed in claim 8.

15. The cured product obtained by curing a composition as claimed in claim 9.

16. The epoxy acrylate resin of claim 1 wherein $R^1$ is a straight chain, branched or cyclic alkyl group substituted with a group selected from the group consisting of alkoxy groups, alkoxy-alkoxy groups, aryloxy groups, aryloxy-alkoxy groups and halogen atoms.

17. The epoxy acrylate resin of claim 1 wherein $R^1$ is an alkoxy group substituted with a group selected from the group consisting of alkoxy groups, alkoxy-alkoxy groups, aryloxy groups, aryloxy-alkoxy groups and halogen atoms.

18. The epoxy acrylate resin of claim 2 wherein $R^1$ is a straight chain, branched or cyclic alkyl group substituted with a group selected from the group consisting of alkoxy groups, alkoxy-alkoxy groups, aryloxy groups, aryloxy-alkoxy groups and halogen atoms.

19. The epoxy acrylate resin of claim 2 wherein $R^1$ is an alkoxy group substituted with a group selected from the group consisting of alkoxy groups, alkoxy-alkoxy groups, aryloxy groups, aryloxy-alkoxy groups and halogen atoms.

* * * * *